(12) United States Patent
Pahl (10) Patent No.: US 10,544,035 B2
(45) Date of Patent: Jan. 28, 2020

(54) SENSOR COMPONENT HAVING TWO SENSOR FUNCTIONS

(71) Applicant: Epcos AG, München (DE)

(72) Inventor: Wolfgang Pahl, München (DE)

(73) Assignee: TDK Corporation, Tokyo (JP)

( * ) Notice: Subject to any disclaimer, the term of this patent is extended or adjusted under 35 U.S.C. 154(b) by 46 days.

(21) Appl. No.: 15/302,128

(22) PCT Filed: Apr. 23, 2015

(86) PCT No.: PCT/EP2015/058814
§ 371 (c)(1),
(2) Date: Oct. 5, 2016

(87) PCT Pub. No.: WO2015/169615
PCT Pub. Date: Nov. 12, 2015

(65) Prior Publication Data
US 2017/0113924 A1    Apr. 27, 2017

(30) Foreign Application Priority Data

May 5, 2014  (DE) .................. 10 2014 106 220

(51) Int. Cl.
*H01L 41/053* (2006.01)
*B81B 7/02* (2006.01)
*H01L 41/113* (2006.01)

(52) U.S. Cl.
CPC .............. *B81B 7/02* (2013.01); *H01L 41/053* (2013.01); *H01L 41/1132* (2013.01); *B81B 2201/0264* (2013.01); *B81B 2201/0278* (2013.01); *B81B 2201/0292* (2013.01); *B81B 2207/012* (2013.01); *B81B 2207/07* (2013.01);
(Continued)

(58) Field of Classification Search
CPC ... H01L 21/67248; H01L 22/12; H01L 23/34; H01L 41/02; B81B 7/0087; B81B 2207/012; B81B 2207/092; B81B 2207/096; B81B 2207/097; B81B 2201/0278

See application file for complete search history.

(56) References Cited

U.S. PATENT DOCUMENTS

2001/0009305 A1* 7/2001 Fjelstad .................. H01L 24/11
                                                        257/776
2006/0185429 A1    8/2006 Liu
(Continued)

FOREIGN PATENT DOCUMENTS

DE    102006046292 A1    4/2008
DE    102007010711 A1    9/2008
(Continued)

*Primary Examiner* — Cheung Lee
(74) *Attorney, Agent, or Firm* — Nixon Peabody LLP (57) ABSTRACT

A sensor component having a MEMS sensor and an ASIC for one sensor function each. A base element, a wall element in the form of a frame and a cover together enclose a cavity of a housing. The MEMS sensor is mounted inside the cavity on the base element of the housing. The ASIC has an active sensor surface and is mounted on or under the cover or is embedded in the cover. Electrical external contacts for the MEMS sensor and ASIC are provided on an external surface of the housing. The cavity has at least one opening or bushing.

5 Claims, 4 Drawing Sheets

(52) U.S. Cl.
CPC ... *B81B 2207/092* (2013.01); *B81B 2207/096* (2013.01); *B81B 2207/097* (2013.01)

(56) References Cited

U.S. PATENT DOCUMENTS

| | | | |
|---|---|---|---|
| 2007/0069000 A1* | 3/2007 | Schubert | B23K 35/3613 228/246 |
| 2007/0164378 A1 | 7/2007 | MacGugan | |
| 2008/0283991 A1* | 11/2008 | Reinert | B81B 7/007 257/685 |
| 2013/0011942 A1 | 5/2013 | Feiertag | |
| 2013/0128487 A1* | 5/2013 | Lo | B81B 7/007 361/813 |
| 2013/0208438 A1 | 8/2013 | Takagi | |

FOREIGN PATENT DOCUMENTS

| | | | |
|---|---|---|---|
| DE | 102008025599 A1 | 1/2009 | |
| DE | 102010006132 A1 | 8/2011 | |
| DE | 102010007605 A1 | 8/2011 | |
| DE | 102010012042 A1 | 9/2011 | |
| DE | 102012215235 A1 | 5/2013 | |
| GB | 2467776 A | 8/2010 | |
| JP | 2007-203451 A | 8/2007 | |
| JP | 2013-517953 A | 5/2013 | |
| JP | 2013-164285 A | 8/2013 | |
| WO | 2013/156539 A1 | 10/2013 | |
| WO | WO 2013156539 A1 * | 10/2013 | H04R 1/04 |

* cited by examiner

SENSOR COMPONENT HAVING TWO SENSOR FUNCTIONS

CROSS-REFERENCE TO RELATED APPLICATIONS

This application is a U.S. National Stage of International Application No. PCT/EP2015/058814, filed on Apr. 23, 2015, which claims the benefit of Germany Patent Application No. 10 2014 106 220.5, filed on May 5, 2014, both of which are incorporated herein by reference in their entireties.

FIELD OF THE INVENTION

Microelectronic sensors, e.g. for sensing pressure and moisture in the ambient air, have been known to date only as separate components. Normally, pressure measurement is effected using an MEMS chip on which piezoresistive resistors sense the bending of a diaphragm over a reference volume.

The measurement of relative humidity is frequently effected by using a polymer as a dielectric in a capacitor that, when water is admitted, has a change in its dielectric properties. The changes are then evaluated as a function of the humidity.

BACKGROUND OF THE INVENTION

The measurement of temperature is frequently effected using resistance sensors, which can have NTC or PTC thermistor properties. Other temperature sensors use the temperature-dependent resonance of resonators or any other temperature-dependent physical variable, preferably an electrical variable.

There are applications in which information from multiple sensors is required at the same time or at the same location. The simultaneous determination of pressure, humidity and, if need be, temperature is necessary e.g. for sensing the current weather, for weather forecasting, for sensing air quality or even for technical purposes, e.g. for determining air density in hard disks with very high capacity for the purpose of stabilizing the magnetic head interval.

It is therefore an object of the present invention to specify a sensor component that provides multiple sensor functions inexpensively. A further object is specification of a housing having minimal dimensions for holding the sensor elements and any evaluation circuits that are required.

SUMMARY OF THE INVENTION

The invention achieves this object by means of a sensor component according to claim 1. Advantageous refinements can be found in further claims.

The sensor component according to the invention comprises a first sensor element that is in the form of an MEMS sensor, for example of chip design. The usually stress-sensitive MEMS sensor is arranged in a cavity, which is formed by a housing cavity, in a manner decoupled from mechanical stresses.

A second sensor element is in the form of an ASIC, that is to say a chip having an integrated circuit and an active sensor area. The second sensor element is arranged on, in or under the cover that closes the housing cavity, that is to say the cavity for the sensor component.

The sensor component has electrical outer contacts that are arranged on an outer area of the housing. The housing itself has a base element, a wall element in the form of a frame and a cover, which together enclose said cavity.

In order to allow a sensor function in the housing, an access from the first sensor element arranged inside the housing and, if need be, also from the second sensor element to the ambient air is required. To this end, the cavity or the housing has at least one opening in the cover, base element or wall element.

The close physical proximity of the two sensor elements allows both sensor functions, that is to say the determination of the two physical parameters, to be performed at the same location. This is advantageous in particular for certain combinations of parameters whose measured values have dependencies on one another, so that measurement thereof at short intervals of space and time using the closely adjacent sensor elements becomes possible to an exact degree.

The arrangement of both sensor elements within one housing or on one housing produces only small dead volumes, so that short response times from both sensor elements are ensured. Since, additionally, a housing for the second sensor element is saved, the two sensor functions are also provided by a sensor component having minimal outer dimensions.

In one embodiment of the invention, the MEMS sensor is mounted without tension on spring contact elements that firstly connect contact areas of the MEMS sensor to inner connections on the inside of the base element and secondly allow the MEMS sensor to be mounted within the housing without tension. The elastic suspension additionally provides the MEMS sensor with good protection against mechanical load, such as against impact, for example. It is also possible for fast or severe temperature changes to be balanced out with the spring contact elements, so that the MEMS sensor can operate correctly regardless of ambient temperature. The stress problem needs to be borne in mind solely because the sensor resolution that is achievable at present corresponds to a diaphragm deflection in the sub-nanometer range. Excessively rigid mounting, as is obtained through bump connection on a rigid substrate, for example, which involves much greater forces being transmitted to the sensor element in the form of a sensor chip via the solder bumps than via a soft adhesive and wire bonding connections, for example. MEMS chips react to tensions in a correspondingly sensitive manner. This is avoided in the case of the invention.

The spring contact elements may be in the form of elongate leaf springs that have one end connected to the base of the housing and have the other end connected to the MEMS sensor at an interval from the base. The spring contact elements may be in singly or multiply angled-off, bent or even spiral form.

The sensor component has at least one ASIC that supports the sensor function of the second sensor element and generates an output value. The second sensor may be implemented completely on or in the ASIC. The ASIC can then be accommodated either on the cover or on the base depending on the proportions.

The ASIC is mounted particularly using flip chip technology. In one refinement, this ASIC can also be used to support the sensor function of the first sensor element and to generate an output value for the latter too. The integration within one semiconductor component allows the volume required for the sensor component to be minimized further. When only one semiconductor component is used, that is to say only one ASIC, for both sensor elements, it is possible for different circuits of the ASIC to be used for both sensor elements jointly. This generates further effects of synergy.

In one embodiment, the first sensor element is in the form of an MEMS pressure sensor.

In one embodiment of the invention, the second sensor element is in the form of a moisture sensor.

In one embodiment of the invention, the second sensor element is in the form of a temperature sensor.

In a further embodiment of the invention, the second sensor element is designed for more or less simultaneous determination of moisture and temperature. In that case, the sensor component has three sensor functions and can deliver appropriate measured values for the three parameters in parallel. These two functions can be implemented on a joint active sensor area, on which two independent measuring elements for the two sensor functions have then been formed if need be, for example a resistor section for determining the temperature and a capacitor for determining a moisture-dependent dielectric constant for a material used as a dielectric in the capacitor. The temperature sensor can also be based on a semiconductor effect and therefore be implemented under the surface inside the ASIC.

For accurate measurements of the two parameters of pressure and moisture, there is also a need for precise temperature measurement close to the first sensor element, which temperature measurement then has to be implemented only once on account of the integration.

In a preferred embodiment, the cover of the housing is in the form of a printed circuit board in which an integrated circuitry is implemented. The circuitry is connected to the second sensor element. The ASIC is furthermore connected to the outer contacts on the bottom of the base element. The electrical connection is effected via the printed circuit board, then runs within the wall element and is finally routed through the base element to the electrical outer contacts.

The electrical connections are made in advance in the various housing parts and have electrical contact made with one another when the single parts are assembled or when the cavity of the housing is closed. This contact connection can be effected by means of soldering. However, it is also possible for the electrical and mechanical connection to be produced by using electrically conductive adhesives.

In one embodiment, the sensor component has an opening in the cover arranged at the top. The active sensor area of the second sensor element is arranged beneath this opening, so that the active sensor area has free and almost unimpeded access to the ambient air. This is advantageous because the second sensor element is reliant on particularly good and fast air exchange in order to deliver up-to-date and correct measured values.

In one embodiment, the second sensor element is arranged and mounted such that it closes the opening in the cover from below or from inside. This can be effected by virtue of the second sensor element being adhesively bonded to the cover by means of an adhesive from below. It is also possible for the second sensor element to be secured to the bottom of the cover at an interval and then for the space between the top of the second sensor element and the bottom of the cover to be filled and sealed with an underfill compound at least along the edges of the second sensor element.

An interval between the second sensor element and the cover can be produced by means of electrical connecting elements, for example, which are in the form of bumps or solder joints. In both cases, the seal, that is to say the adhesive or the underfill compound, is applied such that the active sensor area remains free thereof. In the case of an underfill compound that is processable in liquid form, this can be ensured by virtue of the underfill compound being applied such that they are distributed by capillary forces in the interspace between cover and second sensor element, which capillary forces do not exist beneath the opening, that is to say above the active sensor area, of course, which means that the active sensor area remains free of underfill compound. When adhesive is used, one alternative is for the adhesive to be applied in structured form to the ASIC or the second sensor element. It is also possible for the adhesive to be applied to the bottom of the cover.

In the case of an adhesive bond, the electrical connection between the ASIC and the printed circuit board is made by means of bonding wires. It is also possible for an electrically anisotropically conductive adhesive to be used, which allows electrical conduction only on the shortest path vertically through the adhesive layer.

In one embodiment, the housing has a bushing that connects the inside of the housing, or the cavity, to the surroundings outside the housing. This also ensures a direct connection from the MEMS sensor to the surroundings. The pressure equalization takes place very quickly even in the case of small openings and despite the inner volume. The access to the surroundings also allows determination of the physical parameters in the surroundings of the sensor component as a result of determination within the cavity.

Advantageously, the first sensor element in the form of a pressure sensor is protected against moisture in the surroundings of the sensor component by means of suitable protective measures (e.g. by virtue of the opening being produced in the form of long thin tubes, as a result of diaphragms or hydrophobic filters arranged in between, etc.). This is accommodated by virtue of the pressure equalization being able to be effected sufficiently quickly even in the case of relatively small flow cross sections and additional flow resistances for the cited elements.

The bushing may be a hole that is routed through the cover, the base element or the wall element of the housing.

In one embodiment, the cover is secured on the wall element at such an interval that, between the cover and the wall element, that a bushing is produced that already allows air exchange with the surroundings and hence determination of ambient parameters inside the cavity.

In one embodiment of the invention, it is possible for only one opening or only one bushing to be provided, by means of which the two sensor elements are connected to the surroundings of the housing.

In one embodiment of the invention, the base element is likewise in the form of a printed circuit board. The printed circuit board has at least one inside metallization plane that is connected by means of plated-through holes to the inner pads on the inside of the base element and to the electrical outer contacts on the bottom of the base element.

In one embodiment, the second sensor element is mounted on the bottom of the cover and sealed to the cover by means of a film. In this case, the film—as viewed from inside—is applied over the second sensor element and ends at the cover all around the second sensor element.

In one embodiment, the housing has an opening that is routed through the cover above the second sensor element. The second sensor element is mounted at the bottom of the cover at an interval therefrom, for example via solder contacts, so that a gap remains between cover and second sensor element. This gap provides admittance for air to the cavity and hence also to the second sensor element, said admittance for air rendering a further opening or bushing for the first sensor function superfluous. Conversely, it is also possible to provide a bushing in the region of the first sensor element, in particular through the base element, and thus to produce joint admission of air to the inside of the housing for the first and second sensor elements.

The first sensor element may also be secured on the base element in a conventional manner, for example by means of direct soldering, for example using flip chip design. It is also possible for the first sensor element to be adhesively bonded to the inside of the base element and to be connected to relevant inner pads of the base element by means of bonding wires.

It is also possible to provide an opening over the second sensor element, which opening is sealed from the interior, and additionally to provide an opening through the cover for the first sensor element next to the second sensor element. This makes it possible to cater for the various sensitivities of the two sensor elements toward moisture independently of one another. It is thus possible to provide the second sensor element with the most exposed access to the ambient air possible, in order to allow fast, undistorted measurement of humidity. By contrast, the pressure sensor or the first sensor element can be protected against moisture by means of the measures already cited by way of example above.

In a further embodiment, the second sensor element is embedded in the cover, which can be effected by means of lamination, for example, in which case the second sensor element is laminated in together with one of the laminate layers. An opening for the active sensor area is either produced subsequently or is kept free from the outset in the form of a structured laminate film.

The opening for the second sensor element integrated in the cover can be made from below or from the cavity. However, it is also possible for the opening to be provided at the top directly to the surroundings.

The single housing parts can be produced independently of one another from different materials. Materials that are also used for printed circuit board production are preferred, in particular organic laminates or ceramic multilayer components. The base element and the wall element can be produced in integrated form. However, it is also possible for the base element and the wall element to be produced separately and to be electrically and mechanically connected to one another only subsequently. The cover element is preferably produced separately.

The housing parts can preferably be manufactured in a blank, with multiple housing parts being able to be processed in parallel from a large-area workpiece. By way of example, it is possible for multiple base elements and preferably also the wall elements to be implemented on a first large-area workpiece and for corresponding covers to be prefabricated in parallel on a second workpiece. The two workpieces then each have the sensor elements fitted onto or laminated into them at the relevant locations, and electrical contact is made with said sensor elements. Subsequently, the two workpieces are electrically and mechanically connected to one another and, if need be, sealed.

Subsequently, the sensor components connected by the two workpieces are singularized. This can be effected by means of sawing or any other method of separation, for example. Preferably, prefabricated dividing lines can be produced in at least one of the workpieces, the workpieces having already been at least partially severed at said dividing lines before they are connected to the other workpiece, which means that the singularization step can be conducted in a more reliable fashion.

Alternatively, it is also possible for already singularized and, if need be, function-tested covers to be fitted onto base elements that are still in the cluster. Singularization is effected after completion. This has the advantage that the cavity is already closed upon singularization.

The invention is explained in more detail below with reference to exemplary embodiments and the associated figures. At least some of the figures are shown only schematically and not to scale, which means that neither absolute nor relative dimensional notations can be taken from them. Single parts may also be presented in enlarged form to the point of clarity. Parts that are the same or that have the same effect are denoted by the same reference symbols. Where parts that are the same or that have the same effect are present in practically unaltered form and therefore in clearly identifiable form in multiple figures, the reference symbol may also have been taken from the figure or from the figures in which the designated part first appears. To improve clarity, the relevant reference symbol may then have been omitted.

DETAILED DESCRIPTION

Figure 1:
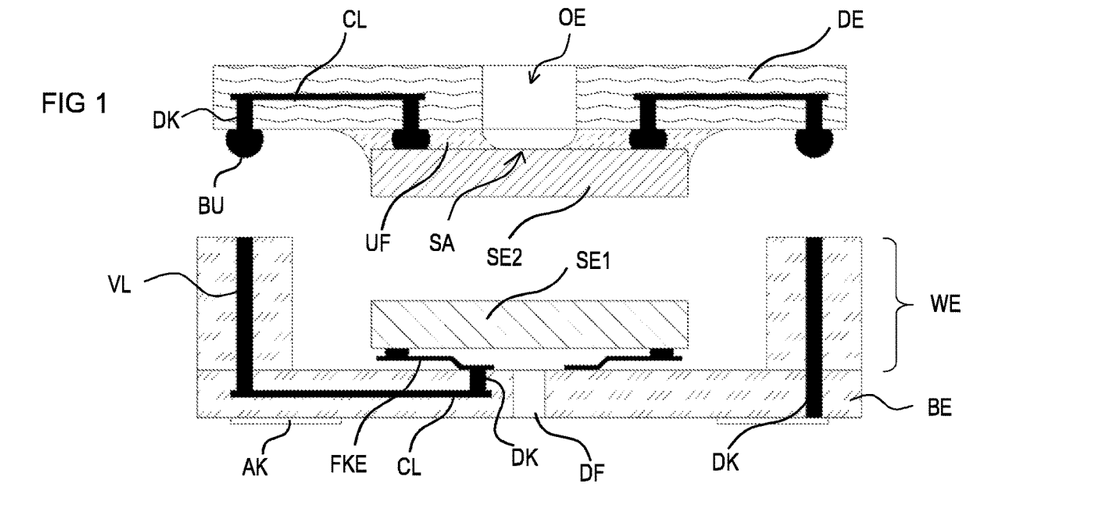
FIG. 1 shows a schematic cross section through a sensor component prior to the cover having been fitted onto a cluster comprising wall element and base element.

FIG. 1 shows a schematic cross section through a sensor component according to the invention during manufacture. The housing has three components, namely a base element BE in flat form, a wall element WE in frame form and a likewise flat cover DE. The wall element WE is preferably produced in a manner integrated with the base element BE or the cover DE. In the figure, the wall element WE is firmly connected to the base element, and may be produced in a manner integrated therewith or may be subsequently put on the base element BE. However, it is also possible for the wall element to be produced in a manner integrated with the cover DE.

In the figure, the base element BE and the wall element WE form a well whose base has the first sensor element SE1 mounted on it on the inside. The electrical and mechanical connection between the first sensor element SE1 and the base element BE, or the inner electrical pads thereof, is made via spring contact elements FKE. These are in the form of elongate leaf springs, one end of which is seated on the base element BE and the other end of which is connected to contact areas of the first sensor element SE1.

The inner pads of the base element BE may be embodied as two-dimensional metallizations. However, it is also possible for a plated-through hole DK to be used, the frontal area of which can have the spring contact element FKE bonded or, for example, soldered to it in a directly electrically conductive manner. The connection between spring contact element FKE and contact areas of the first sensor element SE1 is also made via a solder joint, for example a bump.

The spring contact element FKE can also be structured using an additive process (e.g. by means of lithography and electroplating) directly in situ.

Provided within the base element BE is at least one buried metallization level that is structured and is thus a wiring level CL. The wiring level CL is connected via plated-through holes DK to inner pads of the housing on the top of the base element BE, to outer contacts AK that have been put on the bottom of the base element BE and to connecting lines VL within the wall element WE.

The cover DE likewise has at least one wiring level CL. This is connected by means of plated-through holes DK to contact areas arranged on the bottom of the cover.

Where terms such as above and below or bottom and top are used here and subsequently, this refers to the arrangement shown in the figures, which is of no significance to the operation of the sensor component, however, or for the later arrangement in a circuit environment. Outer contacts AK situated at the bottom are then suitable for mounting the sensor component "on" a printed circuit board, for example.

A second sensor element SE2 is mounted on the bottom of the cover DE and electrically conductively connected to the cover. To this end, it is soldered, for example by means of solder joints, to inner pads or to the plated-through holes within the cover DE that open on the inside. Hence, the second sensor element SE2 is electrically and mechanically connected to the cover DE. The wiring level and possibly further plated-through holes can be used to connect the second sensor element SE2 to the connecting lines VL within the wall element WE. To this end, as shown, it is possible for an appropriate solder deposit for connection to the wall element WE to be provided on the bottom of the cover.

The gap between the second sensor element SE2 and the bottom of the cover DE is filled with an underfill compound UF, for example a resin that can be applied in liquid form. Preferably, capillary forces within the gap between the second sensor element SE2 and the cover DE are utilized in order to allow distribution of the underfill compound UF.

Provided through the cover DE is an opening beneath which the surface of the second sensor element SE2 is exposed. This region contains the active sensor area SA, which is therefore connected to the atmosphere that prevails within the sensor component via the opening OE.

The opening OE is preferably prefabricated before the second sensor element SE2 is mounted on the cover DE, but can also be produced after the second sensor element SE2 is mounted on the cover DE. At any rate, the opening OE is completed before the underfill compound UF is introduced, which means that the capillary forces that are absent in the region of the opening OE ensure that the active sensor area SA remains uncovered by the underfill compound OF.

Figure 2:
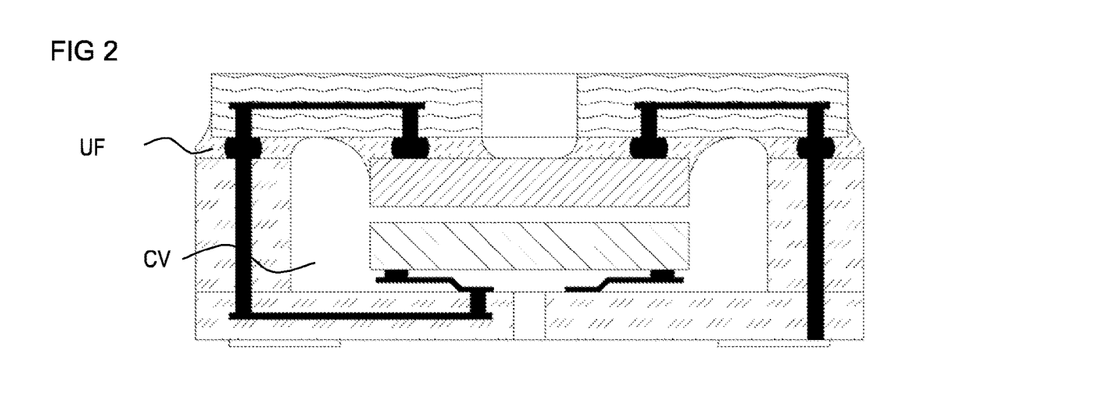
FIGS. 2 to 10 show a schematic cross section through nine embodiments of a sensor component according to the invention.

FIG. 2 shows the parts shown separately in FIG. 1 after the cover DE is connected to the wall element WE. The electrical and mechanical connection is made via a solder point SC, which means that the second sensor element SE2 is connected to outer contacts AK by means of appropriate connecting lines VL. The connecting lines VL may also connect the first sensor element SE1 to the second sensor element SE2. This is advantageous particularly when the second sensor element SE2 comprises an ASIC that performs sensor functions or evaluation of detected measurement values and generation of an output signal for the first sensor element SE1 too.

After the cover DE is mounted on the wall element WE, the gap between cover and wall element can again be filled with an underfill compound UF, the capillary forces between cover DE and wall elements WE again ensuring distribution of the underfill compound UF. The seal encloses a cavity CV within the housing. Only a bushing DF in the base element BE beneath the first sensor element SE1 ensures connection of the cavity CV to the outer surroundings of the sensor component. This bushing can be used for air and pressure exchange, which allows the first sensor element SE1 to measure the relevant parameters of the outer surroundings.

Figure 3:
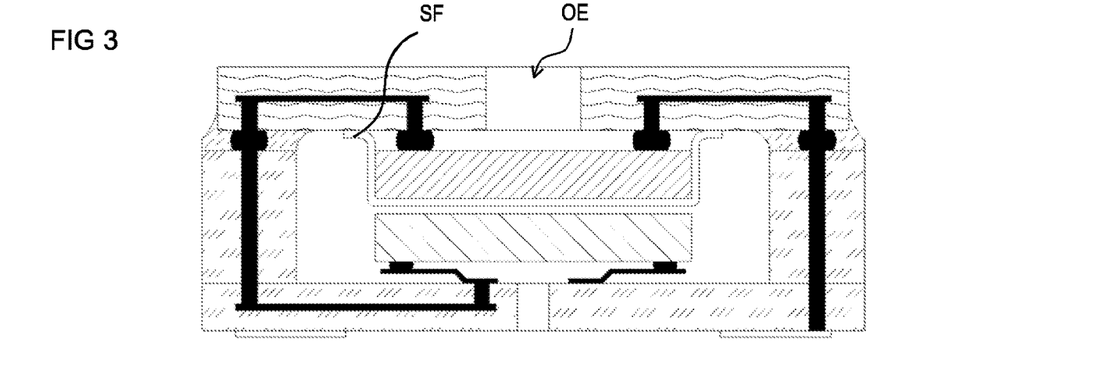

FIG. 3 shows a schematic cross section through a second exemplary embodiment of the invention. In contrast to the first exemplary embodiment shown in FIGS. 1 and 2, the second sensor element SE2 in this case is not sealed from the cover DE with an underfill compound UF. Instead, the second sensor element SE2 is sealed from the cover DE by a protective film SF after mounting on the inside of the cover DE by means of soldering. The protective film encloses the whole second sensor element SE2 from below and seals it to the cover DE. This prevents the opening OE in the cover DE from being able to be used for air exchange with the cavity CV between cover DE, wall element WE and base element BE. The single access to the cavity CV is effected, as previously, via a bushing DF in the base element DE beneath the first sensor element SE1.

Figure 4:
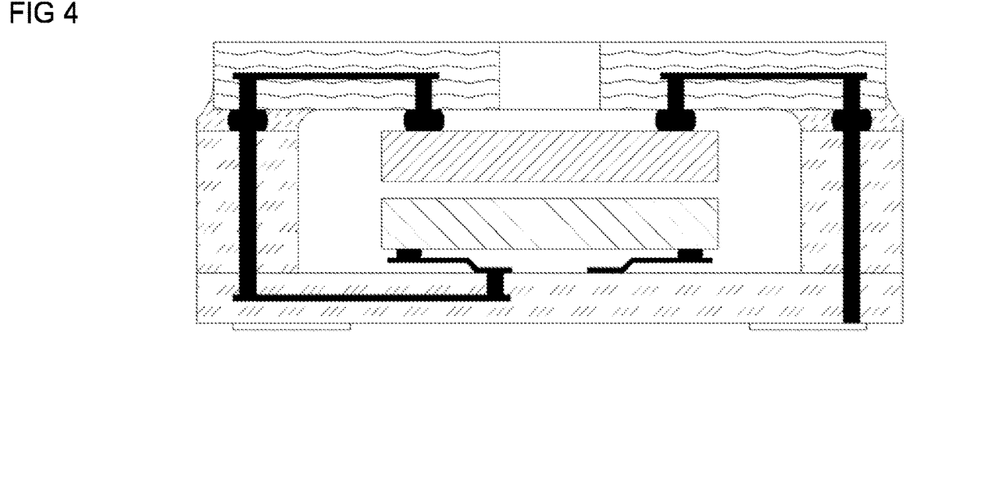

FIG. 4 shows a schematic cross section through a fourth exemplary embodiment. In contrast to the second and third exemplary embodiments, the cavity CV in this case is connected to the ambient air through the opening via a gap GP between cover DE and second sensor element SE2. The opening OE is the only connection of the cavity to the outside, which means that it is used for air exchange and hence pressure equalization, which allows determination of the relevant parameters of the ambient air. A further bushing for the first sensor element is not provided in this case.

Figure 5:
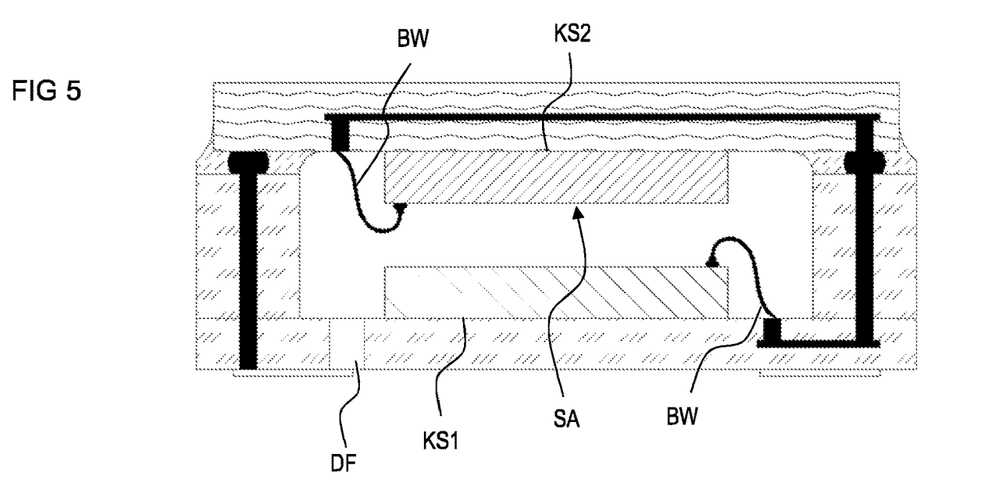

FIG. 5 shows a schematic cross section through a fourth exemplary embodiment, which is distinguished by different mounting of the two sensor elements SE1, SE2.

In this example, one, preferably, as shown, both, sensor element(s) is connected to the base element BE or the cover DE in each case by adhesive bonding by means of an adhesive layer KS1, KS2. The adhesive layer is used solely for mechanical securing. Electrical connection between the sensor elements and the wiring levels and hence to the outer contacts is effected via bonding wires BW, which connect the upward pointing contact areas of the first sensor element SE1 to inner pads of the base element BE, for example, or connect downward pointing contact areas of the second sensor element SE2 to downward pointing pads of the cover DE.

In the base element, a bushing DF that provides a connection to the cavity CV is arranged next to the first sensor element SE2. A further connection to the ambient air, in particular for the second sensor element SE2, is not provided. In this exemplary embodiment, the active sensor area SA of the second sensor element points downward. As a result, both sensor elements SE can access the same volume of air and determine different parameters within this volume.

Figure 6:
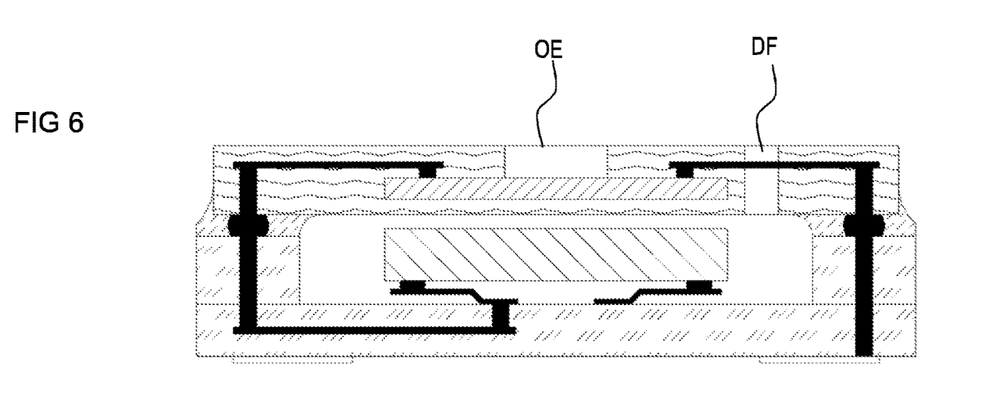

FIG. 6 shows a schematic cross section through a fifth exemplary embodiment of the sensor component. In contrast to the first exemplary embodiment shown in FIGS. 1 and 2, the second sensor element SE2 in this case is embedded within the cover DE and connected to the top of the cover DE or the ambient air only by an upward pointing opening. The downward pointing bottommost layer of the cover DE isolates the second sensor element SE2 from the cavity CV. In that case, a bushing DF into the cavity is provided, said bushing being routed through the cover DE in this case in FIG. 6. However, it is also possible for the bushing DF to be routed through the base element.

Figure 7:
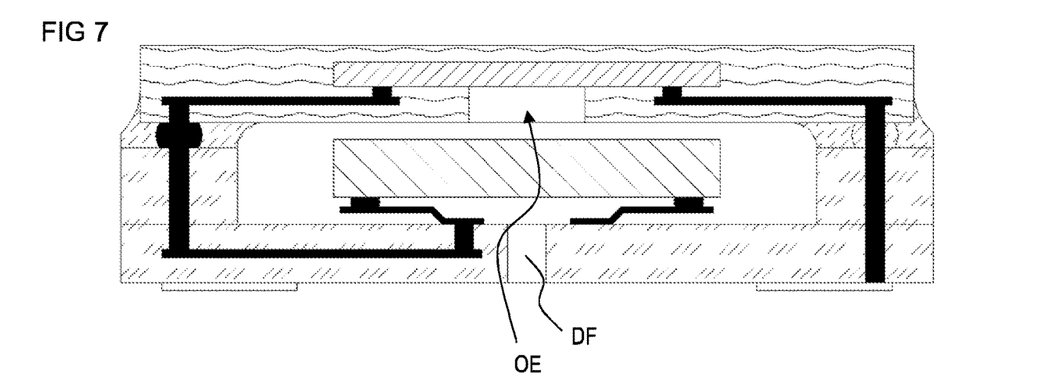

FIG. 7 shows a schematic cross section through a sixth exemplary embodiment, in which the second sensor element SE2, as in the fifth exemplary embodiment, is likewise recessed in the cover DE. In contrast to the previous exemplary embodiment, the opening OE points downward, which means that the active sensor area SA is connected to the cavity CV inside the housing by the opening OE. The cavity CV is connected to the ambient air via a bushing DF through the base element BE, so that the parameters to be determined inside the cavity CV can be detected via the first and second sensor elements.

FIGS. 8-11 subsequently present housings that, for the sensor combinations pressure/moisture sensor and pressure/temperature sensor, afford the optimum prerequisites in each case for the two sensors that differ in this manner. From the base side, the cavity and the stress-decoupling spring structures protect the pressure sensor from stress. A dedicated access for the measured variable "pressure" allows the pressure sensor to be protected from moisture separately. By contrast, the moisture sensor arranged on a cover side and embedded in the substrate affords an optimally exposed measurement area. In this case, the access for the measured variable "humidity" is arranged on a housing outer area that is opposite the access for the measured variable "pressure".

Figure 8:
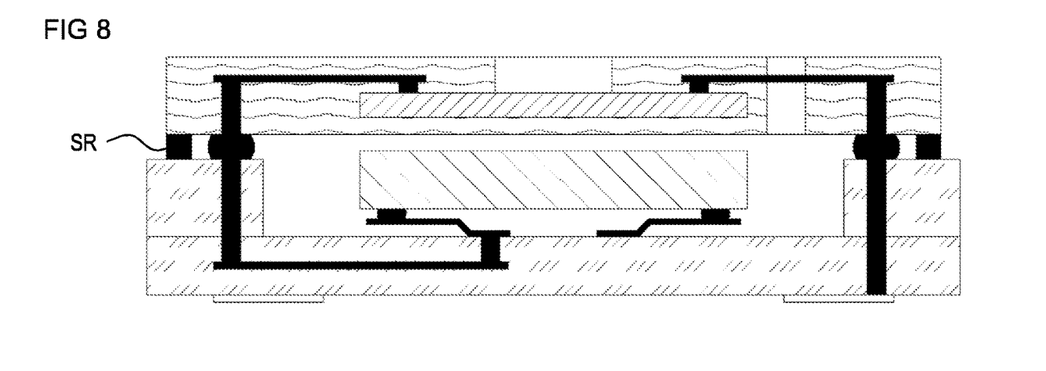

FIG. 8 shows a schematic cross section through a seventh exemplary embodiment. This exemplary embodiment essentially corresponds to the fifth exemplary embodiment shown in FIG. 6, the difference being that there is no sealing underfill compound provided between cover DE and wall element WE. To seal the cavity CV, there is a sealing ring SR provided for this purpose between cover DE and wall element WE, said sealing ring being arranged in the edge region of the cover DE or wall element WE and sealing the cavity CV completely. The first sensor element SE1 and the cavity CV are connected to the ambient air via a bushing DF, which in this case is provided in the cover DE, but may equally be provided in the base element BE.

Additionally, it is possible for the sealing ring SR presented here to be used alternatively in the other exemplary embodiments too.

Figure 9:
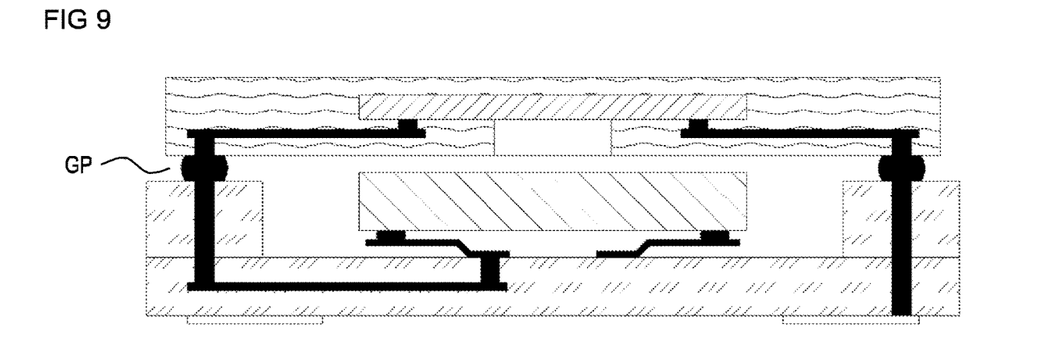

FIG. 9 shows a schematic cross section through an eighth exemplary embodiment. This is in a similar form to the sixth exemplary embodiment shown in FIG. 7, the difference being that the underfill compound UF between cover DE and wall element WE is omitted in this case too. The cavity CV within the housing remains unsealed thereby, so that there remains a connection to the cavity through the corresponding gap GP between cover DE and wall element WE and between the solder points, which connect the first and second sensor element SE1, SE2 to the ambient air. A further opening or bushing is not required.

Figure 10:
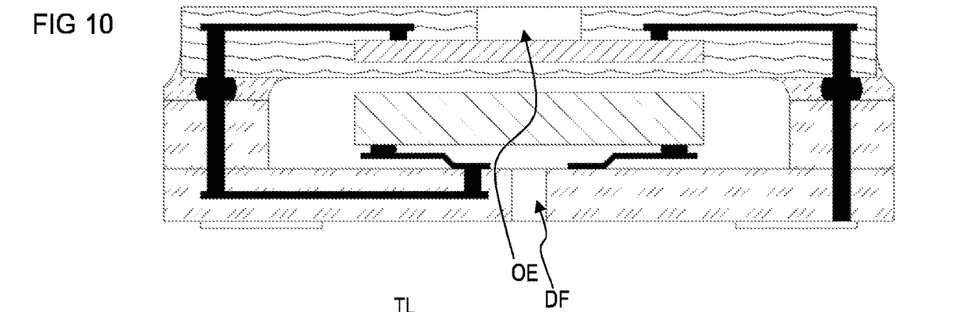
Figure 11:
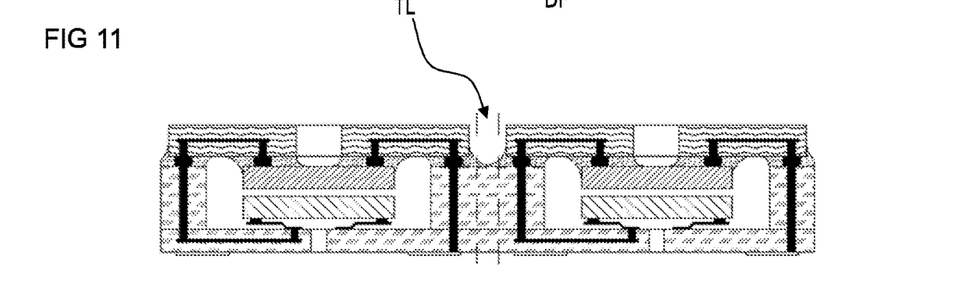
FIG. 11 shows a possible structuring for a cover manufactured in a blank.

FIG. 10 shows a schematic cross section through a ninth exemplary embodiment. In this case, the second sensor element SE2 is buried within the cover DE and connected to the ambient air via an upward routed opening OE. The cavity CV is connected to the ambient air via a bushing DF beneath the first sensor element SE1. Otherwise, the cavity is sealed by an underfill compound UF or another measure as described above.

For simpler manufacture of the sensor component according to the invention, it is possible to use a multiple blank. This is appropriate in particular for the base element BE. To this end, in a larger workpiece, base elements BE are connected to corresponding wall elements WE, so that a regular grid of later single components is produced on the common multiple blank. Base elements BE and wall elements WE are then processed further as described with reference to FIG. 1 and in the first exemplary embodiment. It is then possible for single covers DE for the single components to be fitted onto the multiple blank with base elements and wall elements. However, it is also possible for the cover DE also to be embodied as a multiple blank and to be fitted as a large area unit onto the first multiple blank with base and wall elements.

The multiple blank for the cover DE is also processed to completion and fitted with second sensor elements SE2 in the manner of a single cover. Said second sensor elements may be mounted beneath the cover DE as in the exemplary embodiment from FIG. 11. However, it is also possible to use multiple blanks for the cover that have second sensor elements integrated in them.

After the multiple blank for the cover DE has been fitted, the cavities in the single components can be sealed in one step, for example by applying the underfill compound. This can again be effected by utilizing capillary forces in the joint gap between multiple blank for cover and multiple blank for wall and base elements. To this end, an access to the gap needs to be provided in the cover at at least one point, but preferably in the region between two adjacent covers for single components in each case, for example by drilling or sawing through the cover.

Figure 12:
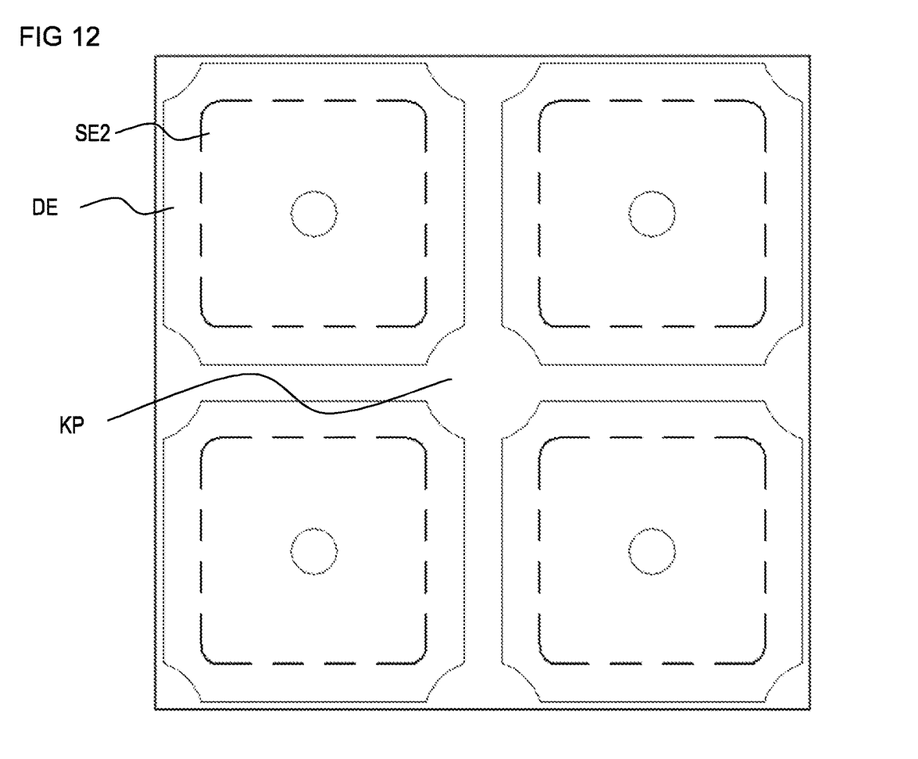
FIG. 12 shows a schematic cross section through the manufacture of a sensor component and a multiple blank each for base element and cover.

Application of the underfill compound can be facilitated if the multiple blank for the cover allows simpler distribution of the underfill compound. FIG. 12 shows an example of structuring of the multiple blank for the cover, which structuring also corresponds to the sectional image in FIG. 11. To this end, the horizontal gap GP between cover and wall element is opened from above along dividing lines TL between two rows in each case and between two columns in each case, using a suitable method, such as sawing, etching or laser structuring, for example. A sawing method is appropriate, since an endpoint for the structuring is provided by the gap as soon as the latter is open. At the crossing points KP where vertical and horizontal dividing lines TL cross, larger-area cutouts are provided in the multiple blank for the cover, which can then have the underfill compound introduced into them in a simple manner by means of dispensing or pin transfer. Capillary forces then distribute the underfill compound into the regions where the second sensor element and the cover overlap and are separated only by the narrow gap, which can trigger off the relevant capillary action.

In FIG. 12, the overlap area with the capillary action corresponds to the area enclosed by the dashed line, which area corresponds to the upper surface of the second sensor element SE2 minus the opening OE in the cover, in which the top of the sensor element is exposed and in which also no capillary forces act on account of the absence of a gap.

After the cavities CV in all the sensor components in a multiple blank are sealed and after the underfill compound has hardened, the single sensor components are singularized from the multiple blank by means of separation. This can likewise again be effected by means of cutting, milling, lasering or sawing along the dividing lines.

Although the method for manufacturing the sensor components by means of multiple blanks has been presented for one embodiment only, most embodiments are likewise suitable for being performed using a multiple blank. Since this is linked to considerable facilitations of the method, working using a multiple blank is preferred for manufacturing the sensor components.

In this approach, it may also be advantageous for single steps that are performed for the single component in the indicated beneficial order to be performed in a different order using a multiple blank. By way of example, it is possible for openings and bushings to be introduced only in a later step. In parallel therewith, it is also possible for dividing lines to be prefabricated along the dividing lines TL in the multiple blank for the cover and, by way of example, for this to be accomplished by producing trenches in the multiple blank for the cover that do not completely perforate the cover, so that it can still be fitted onto the blank for base and wall elements as a coherent entity, that is to say as a multiple blank. This facilitates particularly the opening of the gaps, since this requires less material to be removed and the ingress of particles or gases into the cavity before the underfill compound is introduced can be avoided. The exemplary embodiments and embodiments presented in the figures differ only in a few details in some cases.

The invention is not limited to the presented combinations of details, however. Instead, it is possible for details described on the basis of single exemplary embodiments to be used for other exemplary embodiments too, or for single features and details to be combined differently in new exemplary embodiments. The invention is therefore not limited to the exemplary embodiments presented in the figures.

The invention claimed is:

1. A sensor component
having a first and a second sensor element for a respective sensor function,
having a housing that has a base element, a wall element in the form of a frame and a cover, which together enclose a cavity,
in which the first sensor element is an MEMS sensor and is mounted inside the cavity on the base element of the housing,
in which the second sensor element is in the form of an ASIC having an active sensor area and is mounted on or under the cover or embedded in the cover,
in which the active sensor area of the second sensor element is accessible from the inside of the housing,
in which electrical outer contacts are provided on an outer area of the housing,
in which the housing has a bushing that connects the inside of the housing to the surroundings outside the housing to provide access of surroundings to the MEMS sensor and the active sensor area of the second sensor element as well,
in which the MEMS sensor is mounted without tension on spring contact elements that connect the contact areas of the MEMS sensor to inner pads on the inside of the base element, in which at least one sensor function is integrated on or in the ASIC and in which the ASIC generates an output value.

2. The sensor component according to claim 1, in which the first sensor element is an MEMS pressure sensor.

3. The sensor component according to claim 1, in which the cover comprises a printed circuit board having an integrated circuitry, in which the electrical connection between the ASIC on the printed circuit board and the electrical outer contacts runs within the wall element and through the base element.

4. The sensor component according to claim 1, in which only one opening or only one bushing is formed in the base element beneath the first sensor element that connects the two sensor elements to the surroundings outside the housing.

5. The sensor component according to claim 1, in which the second sensor element is a temperature sensor and/or a moisture sensor.

* * * * *